US010155657B2

(12) United States Patent
Steiert et al.

(10) Patent No.: US 10,155,657 B2
(45) Date of Patent: Dec. 18, 2018

(54) ELECTRONIC SENSOR DEVICE INCLUDING A FLIP-CHIP MOUNTED SEMICONDUCTOR CHIP AND A SUBSTRATE WITH AN OPENING

(71) Applicant: Infineon Technologies AG, Neubiberg (DE)

(72) Inventors: Matthias Steiert, Rosenheim (DE); Kok Yau Chua, Melaka (MY); Chu Hua Goh, Malacca (MY); Woon Yau Lim, Melaka (MY); Christina Yeong, Johor (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/248,651

(22) Filed: Aug. 26, 2016

(65) Prior Publication Data
US 2017/0081175 A1  Mar. 23, 2017

(30) Foreign Application Priority Data
Sep. 23, 2015  (DE) .................. 10 2015 116 081

(51) Int. Cl.
B81B 7/00 (2006.01)
B81C 1/00 (2006.01)

(52) U.S. Cl.
CPC .......... B81B 7/007 (2013.01); B81C 1/00301 (2013.01); *B81B 2201/0264* (2013.01)

(58) Field of Classification Search
CPC .................. B81B 7/0061; B81B 7/007; B81B 2201/0264; B81C 1/00301
See application file for complete search history.

(56) References Cited

U.S. PATENT DOCUMENTS

| 6,140,144 A * | 10/2000 | Najafi ................. B81C 1/00269 438/106 |
| 6,441,503 B1 | 8/2002 | Webster |
| 7,898,043 B2 * | 3/2011 | Ziglioli ................ B81B 7/0061 257/414 |
| 2008/0179697 A1 * | 7/2008 | Cortese ................ B81B 7/0061 257/415 |
| 2009/0155955 A1 * | 6/2009 | Liang .................... H01L 21/56 438/108 |
| 2011/0092009 A1 * | 4/2011 | Ziglioli ................ B81B 7/0061 438/51 |

(Continued)

FOREIGN PATENT DOCUMENTS

| DE | 10 2014 105 996 | 10/2014 |
| DE | 10 2014 117 209 | 5/2015 |

*Primary Examiner* — Sitaramarao S Yechuri
(74) *Attorney, Agent, or Firm* — Dicke, Billig & Czaja, PLLC

(57) ABSTRACT

The electronic device comprises a semiconductor chip comprising a first main face, a second main face opposite to the first main face, side faces connecting the first and second main faces, and a sensor element or actuator element disposed at the first main face, and a substrate, wherein the semiconductor chip is disposed above the substrate, the first main face of the semiconductor chip facing the substrate, wherein the substrate comprises a substrate opening, the substrate opening permitting passage of signals to the sensor element or from the actuator element.

26 Claims, 8 Drawing Sheets

(56) References Cited

U.S. PATENT DOCUMENTS

| | | | |
|---|---|---|---|
| 2012/0093346 A1* | 4/2012 | Feiertag | H04R 1/2884 |
| | | | 381/174 |
| 2012/0164775 A1 | 6/2012 | Baldo et al. | |
| 2012/0280335 A1 | 11/2012 | Zoellin et al. | |
| 2014/0001582 A1* | 1/2014 | Kuo | H01L 23/49575 |
| | | | 257/417 |
| 2015/0014798 A1* | 1/2015 | Faralli | B81B 3/00 |
| | | | 257/416 |

* cited by examiner

ELECTRONIC SENSOR DEVICE INCLUDING A FLIP-CHIP MOUNTED SEMICONDUCTOR CHIP AND A SUBSTRATE WITH AN OPENING

CROSS-REFERENCE TO RELATED APPLICATION

This Utility Patent Application claims priority to German Patent Application No. 10 2015 116 081.1, filed Sep. 23, 2015; and which is incorporated herein by reference.

TECHNICAL FIELD

The present disclosure relates to an electronic device and a method for fabricating an electronic device.

BACKGROUND

The present disclosure in general relates to sensor or actuator devices like, for example, pressure sensors. Pressure sensors are typically used to measure pressure of liquids or gases and provide an output signal varying with the pressure of the medium. For doing so, the pressure sensor will have to be placed in the vicinity of the medium for sensing its pressure. One problem related thereto is to provide a connection between the outer space in which the medium is present and the actual sensor element of the sensor device. The same problem exists for actuator elements.

DETAILED DESCRIPTION

Figure 1A:
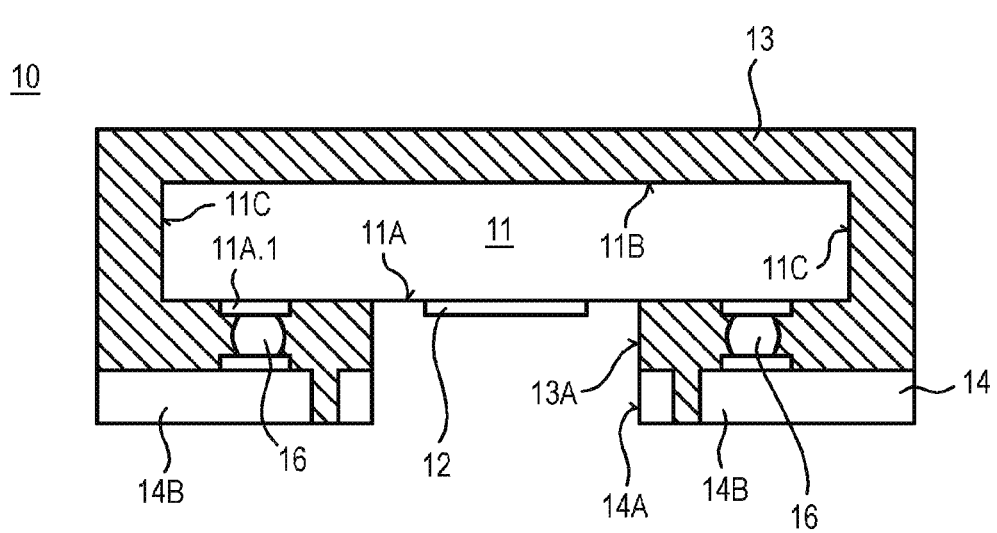
FIG. 1 comprises FIGS. 1A and 1B and shows a schematic cross-sectional side view representation (A) and a down view representation (B) of an electronic device comprising an encapsulation material comprising an opening the wall of which is exposed to the outside.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments or examples. It may be evident, however, to one skilled in the art that one or more aspects of the embodiments or examples may be practiced with a lesser degree of the specific details. In other instances, known structures and elements are shown in schematic form in order to facilitate describing one or more aspects of the embodiments or examples. It is to be understood that other embodiments or examples may be utilized and structural or logical changes may be made without departing from the scope of the present disclosure. It should be noted further that the drawings are not to scale or not necessarily to scale.

In the following detailed description, reference is made to the accompanying drawings, which form a part hereof, and in which is shown by way of illustration specific aspects in which the disclosure may be practiced. In this regard, directional terminology, such as "top", "bottom", "front", "back", etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise. Any particular or special feature shown and described in connection with one particular embodiment is meant to be applicable in the other embodiments as well.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present disclosure is defined by the appended claims.

The examples of an electronic device comprise a sensor chip which comprises a sensor element or an actuator chip which comprises an actuator element. The electronic device may also comprise further chips like, for example, a controller chip, or an ASIC chip. The semiconductor chips can be manufactured on the basis of a specific semiconductor material, for example Si, SiC, SiGe, GaAs, GaN, AlGaAs, but can also be manufactured on the basis of any other semiconductor material and, furthermore, may contain inorganic and/or organic materials that are not semiconductors, such as for example insulators, plastics or metals.

One or more of the semiconductor chips, in particular the sensor chip, may comprise contact elements or contact pads on one or more of their outer surfaces wherein the contact elements serve for electrically contacting the semiconductor chip and are connected with an internal electrical circuit of the semiconductor chip. The contact elements may have any desired form or shape. They can, for example, have the form of lands, i.e. flat contact layers on an outer surface of the semiconductor package. The contact elements or contact pads may be made from any electrically conducting material, e.g. from a metal as aluminum, gold, or copper, for example, or a metal alloy, or an electrically conducting organic material, or an electrically conducting semiconductor material. The contact elements of the semiconductor chip may also comprise a diffusion barrier and/or adhesion layers. A thin WTi layer on the contact element may, for example, effect such a diffusion barrier.

The examples of an electronic device may comprise an encapsulant or encapsulating material for embedding the semiconductor chip or other insulating or dielectric materials. These encapsulating, insulator or dielectric materials can be any electrically insulating material like, for example, any kind of molding material, any kind of resin material, or any kind of epoxy material. The mentioned materials can also comprise one or more of a polymer material, a polyimide material, a thermoplast material, a silicone material, a ceramic material, and a glass material. The mentioned materials may also comprise any of the above-mentioned materials and further include filler materials embedded therein like, for example, thermally conductive increments. These filler increments can be made of AlO or $Al_2O_3$, AlN, BN, or SiN, for example. Furthermore the filler increments may have the shape of fibers and can be made of carbon fibers or nanotubes, for example. After its deposition the encapsulant, for example, may be only partially hardened and may be completely hardened after application of energy (e.g. heat, UV light, etc.) to form an encapsulant. Various techniques may be employed to cover the semiconductor chips with the encapsulant, for example one or more of compression molding, transfer molding, injection molding, film-assisted molding, power molding, liquid molding, dispensing or laminating.

The sensor chip may be a micro-electro-mechanical chip, also known as MEMS (micro-electro-mechanical systems) chip. Micro-electro-mechanical chips allow for very small electronic devices and in most cases contain a mechanically fragile structure. An example of micro-electro-mechanical chips are MEMS microphones. In an MEMS microphone, the mechanically fragile structure may be a membrane. MEMS microphones are used e.g. in cell-phones, laptops and tablets. Other micro-electro-mechanical systems may comprise sensors and actors, for examples gyroscopic sensors.

Further, the sensor chip may comprise a micro-optical-mechanical system, or in other words, the mechanically fragile structure may be a micro-optical-mechanical structure or a micro-optical-electrical-mechanical structure. E.g., a mechanical deflection of the fragile structure may be detected optically. The chip may be an MOEMS chip which stands for an optical MEMS chip.

The sensor chip may also comprise or be part of any kind of sensors, transducers or actuators as, for example, pressure sensors, acceleration sensors, rotation sensors, elongation sensors, microphones etc. The sensor chip may comprise an electromechanical element which may be e.g. a bridge, a membrane, or a tongue structure. The sensor chip may comprise an opticalmechanical element.

A microphone MEMS chip may comprise a membrane. The membrane may be a flexible membrane. The microphone MEMS chip may further comprise a fixed or rigid plate which may be called a back plate. The back plate or back electrode and the membrane may form together a detection capacitor with variable capacitance. They may form a transducer transforming acoustic waves into electric voltage variations. Further MEMS chips may be configured as angular position sensors, motion sensors, Hall sensors or GMR sensors (GMR: giant magneto resistance).

A first aspect of the present disclosure is related to an electronic device.

Figure 1B:
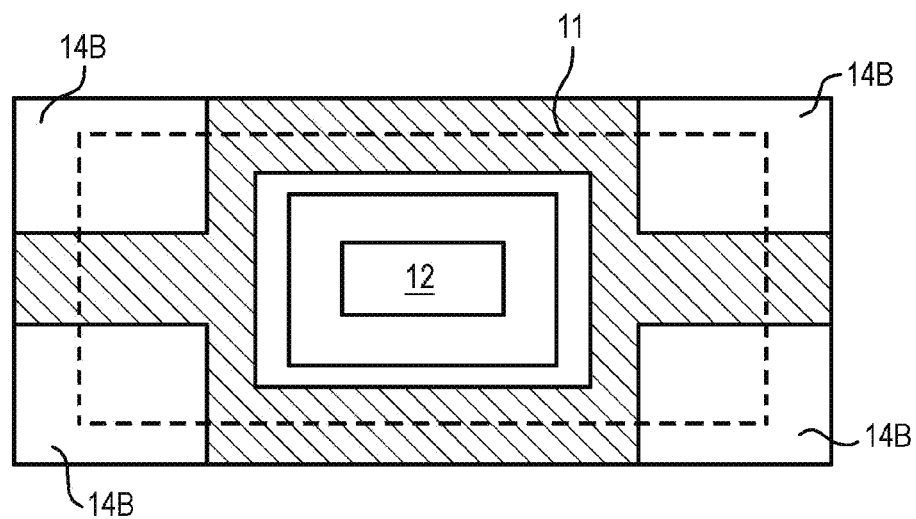

FIG. 1 comprising FIGS. 1A and 1B shows an electronic device according to an example. The electronic device 10 of FIG. 1 comprises a semiconductor chip 11 comprising a first main face 11A, a second main face 11B opposite to the first main face 11A, side faces 11C connecting the first and second main faces 11A and 11B, and a sensor element or actuator element 12 disposed at the first main face 11A. The electronic device 10 further comprises a substrate 14, wherein the semiconductor chip 11 is disposed above the substrate 14. The semiconductor chip 11 is arranged in a flip-chip configuration so that the first main face 11A of the semiconductor chip 11 faces the substrate 14. The substrate 14 comprises a substrate opening 14A, the substrate opening 14A permitting passage of signals to the sensor element 12 or from the actuator element 12. According to an example the sensor element 12 or actuator element 12 is not flush with the first main face 11A but disposed in a recess formed in the first main face 11A. In the following, the term "sensor element" automatically also includes "actuator element", if not said otherwise. The substrate 14 may comprise or be made of a leadframe, a laminate layer, a multi-layer substrate, a molded substrate or any other kind of substrate.

According to an example of the first aspect, the electronic device 10 further comprises an encapsulation material 13 covering the second main face 11B, the side faces 11C and a portion of the first main face 11A of the semiconductor chip 11. The encapsulation material 13 comprises an encapsulation material opening 13A adjacent to the sensor element 12 so that the sensor element 12 is exposed to the outside. According to the example as shown in FIG. 1A the encapsulation material 13 is exposed to the outside at the encapsulation material opening 13A.

According to the above, in other words, the semiconductor chip 11 is embedded in the encapsulation material 13 and the encapsulation material 13 and the substrate 14 each comprise an opening or cut-out 13A and 14A, respectively, which permits the passage of signals to and/or from the sensor element 12 or the actuator element 12.

According to an example of the electronic device of the first aspect, the substrate opening 14A at least partially overlaps with the encapsulation material opening 13A. The substrate opening 14A can, for example, have the same size and dimensions as the encapsulation material opening 13A or it can have a somewhat smaller size and dimensions. Both openings 13A and 14A may have a common symmetry axis, in particular cylinder symmetry axis, as can be seen for example in FIG. 1B.

According to an example of the electronic device of the first aspect, the semiconductor chip 11 comprises at least one contact pad 11A.1 at the first main face 11A, the contact pad 11A.1 being connected with a contact area of the substrate 14, e.g. a portion 14B of the leadframe 14. The contact pad 11A.1 of the semiconductor chip 11 may be connected to the contact area via a through-connection formed in the encapsulation material 13. The through-connection may be formed by a copper pillar or copper bump 16 which can be fabricated, for example, by galvanic plating.

According to an example of the electronic device of the first aspect, the sensor element 12 comprises a pressure sensor, in particular a capacitive pressure sensor.

According to another example of the electronic device of the first aspect, the wall of the encapsulation material opening is not exposed to the outside, but instead a ring-like structure of an adhesive or a glue is disposed at an entire wall of the encapsulation material opening. The glue may be configured as an adhesive or glue which comprises anisotropic properties, i.e. an anisotropic electrical conductivity wherein it is originally non-conductive but may become conductive upon the exertion of pressure. In such an example, the copper pillars or bumps would extend through the adhesive or the glue to the contact areas of the substrate. The ring-like structure is applied to the semiconductor chip before applying the encapsulation material in order to prevent the encapsulation material to enter into the area above the sensor element. Examples thereof will be shown and described later in more detail.

According to an example of the electronic device of the first aspect, the sensor element 12 is configured as a MEMS structure.

According to an example of the electronic device of the first aspect, the electronic device is configured as a microphone device.

According to an example of the electronic device of the first aspect, the substrate opening comprises a ring-like protrusion which is integral with the substrate and extends towards the first main face of the semiconductor chip. An example thereof will be shown and explained later.

Figure 2A:
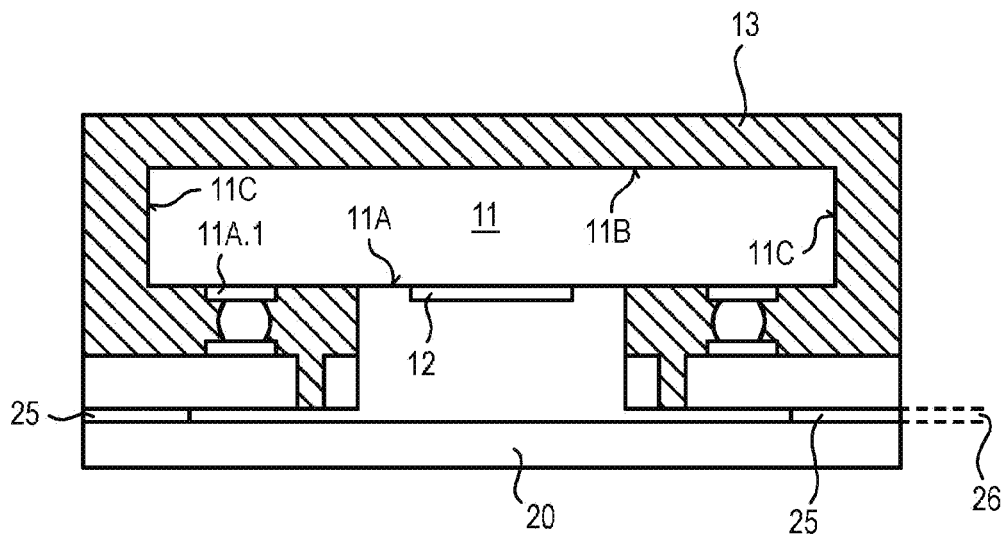
FIG. 2 comprises FIGS. 2A and 2B and shows a schematic cross-sectional side view representation (A) and a down view representation (B) of the electronic device according to FIG. 1 after being mounted onto a printed circuit board (PCB).
Figure 2B:
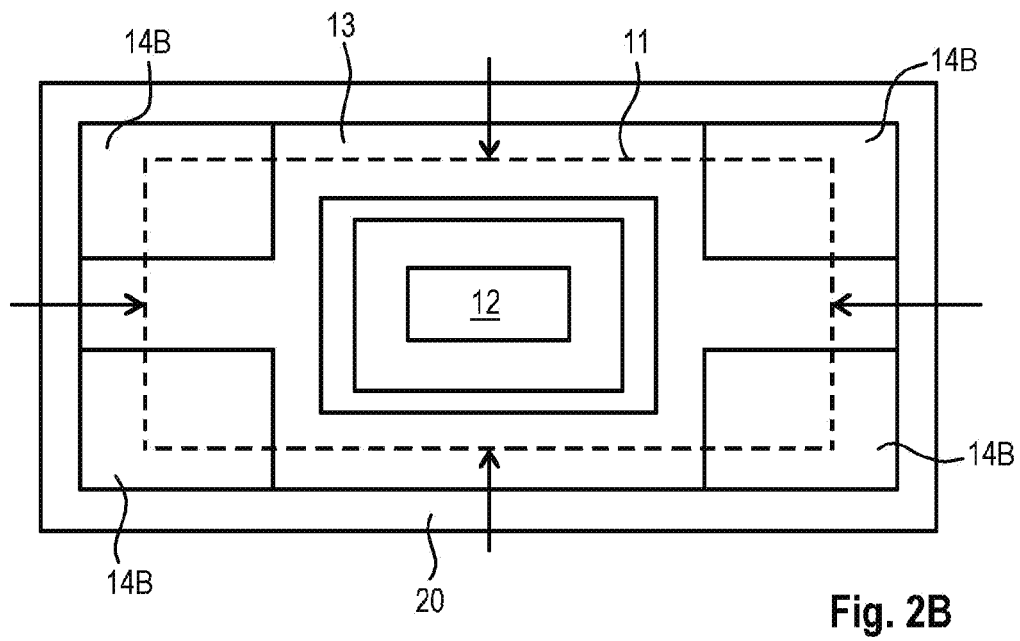

FIG. 2 comprising FIGS. 2A and 2B shows the customer side mounting of the electronic device of FIG. 1 to a substrate like, for example, a printed circuit board (PCB). As can be seen in FIG. 2B, the substrate 14 may comprise four substrate portions 14B which may be used for making contact with the PCB 20, i.e. with respective electrical contact areas (not shown) on the PCB 20. For this purpose solder pads 25 can be deposited on these electrical contact areas on an upper surface of the PBC 20, the solder pads 25 being positioned relative to each other in the same way as the substrate portions 14B are spaced from each other. Then, the electronic device 10 will be placed on the PCB 20 with the substrate portions 14B set down on the solder pads 25 and after a reflow process the electronic device 10 will be fixedly attached to the PCB 20. As can be seen in FIG. 2A, due to the vertical dimension of the solder pads 25, a lower surface of the substrate portions 14B will be spaced apart from an upper surface of the PCB 20 by a gap 26. Due to this gap 26 a connection is provided between the outer atmosphere and the sensor element 12. As shown in FIG. 2B by the arrows, air or whatever medium can flow through the intermediate spaces between the substrate portions 14B to the sensor element 12 of the electronic device 10.

A second aspect of the present disclosure is also related to an electronic device. An electronic device according to the second aspect comprises a semiconductor chip comprising a first main face comprising a MEMS structure disposed thereon, and a substrate, wherein the semiconductor chip is mounted on the substrate in a flip-chip configuration, and wherein the substrate comprises a substrate opening, the substrate opening permitting passage of signals to or from the MEMS structure.

The examples and features shown and described above and below in connection with the first aspect can also applied to the electronic device of the second aspect as outlined above.

A third aspect of the present disclosure is related to a method for fabricating an electronic device.

The method comprises providing a semiconductor chip comprising a first main face, a second main face opposite to the first main face, side faces connecting the first and second main faces, and a sensor element or an actuator element disposed at the first main face, providing a substrate, the substrate comprising a substrate opening, and disposing the semiconductor chip above the substrate so that the first main face of the semiconductor chip faces the substrate and the substrate opening is situated below the sensor element or actuator element, thereby permitting passage of signals to the sensor element or from the actuator element.

According to an example, the method further comprises applying an encapsulation material to the semiconductor chip in such a way that the encapsulation material covers the second main face, the side faces and a portion of the first main face, wherein the encapsulation material comprises an encapsulation material opening adjacent to the sensor element so that the sensor element is exposed to the outside.

According to an example of the method, applying the encapsulation material is performed in such a way that at least a part of a wall of the encapsulation material opening is exposed to the outside. This can be achieved, for example, by film-assisted molding with the help of a stamp as will be shown in the following.

Figure 3A:
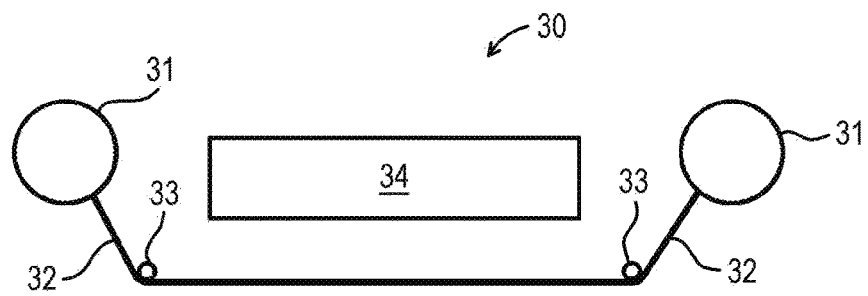
FIGS. 3A-E show schematic cross-sectional side view representations for illustrating a method for fabricating an electronic device of FIG. 1 according to an example.
Figure 3A:
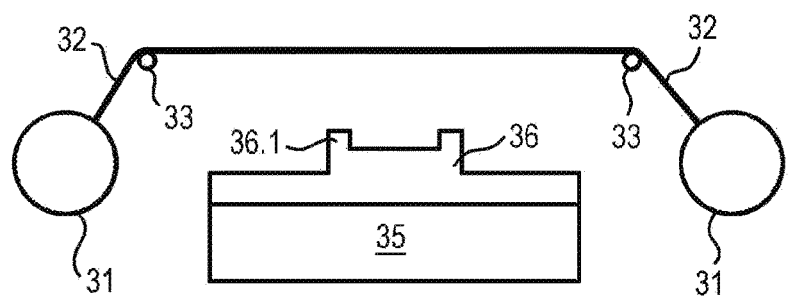

FIG. 3 comprises FIGS. 3A-3E and shows schematic cross-sectional side view representations for illustrating a method for fabricating an electronic device by utilizing film-assisted molding (FAM). FAM is a variation of the transfer molding process. FAM uses one or two plastic films 32 fed by a series of rollers 31 into the interior space of a molding apparatus 30 as shown in FIG. 3A. The molding apparatus 30 comprises an upper mold tool 34 and a lower mold tool 35 wherein a stamp 36 is disposed on an upper surface of the lower mold tool 35. The first and second mold tools 34 and 35 can be moved relatively to each other in the vertical direction, i.e. either one of the first and second mold tools 34 and 35 can be moved relatively to the other one wherein the other one is fixed, or both of the first and second mold tools 34 and 35 can be moved relatively to each other. In the example, as shown in FIG. 3, the second mold tool 35 can be moved from the position as shown in FIG. 3A in a vertical direction towards the first mold tool 34.

Figure 3B:
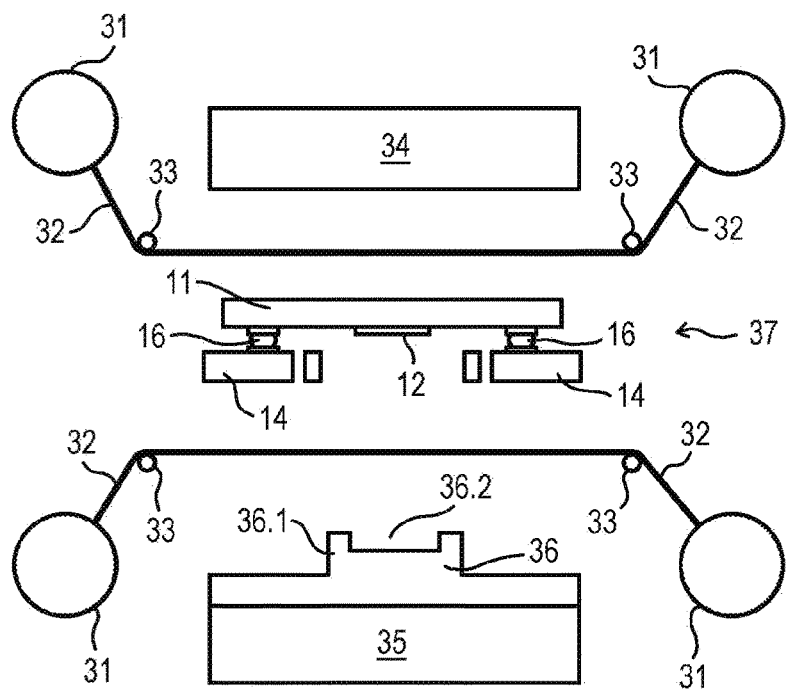

FIG. 3B shows the molding apparatus after loading in the product 37 to be encapsulated wherein the product 37 corresponds to the semiconductor chip 11 connected to the substrate 14 by means of the copper pillars 16 as shown in FIG. 1. It is evident in FIG. 3B that the first active main face 11A with the sensor element 12 is facing towards the second mold tool 35 and the stamp 36. The stamp 36 maybe configured in such a way that it comprises a quadratic or rectangular ring-like elevation 36.1 surrounding a recess 36.2. The dimensions are such that a lateral width of the recess 36.2 is greater than a lateral dimension of the sensor element 12 of the semiconductor chip 11. In this way, after pressing the film 32 by the second mold tool 35 and the stamp 36 against the first main face 11A of the semiconductor chip 11, the area at and around the sensor element 12 is optimally protected.

Figure 3C:
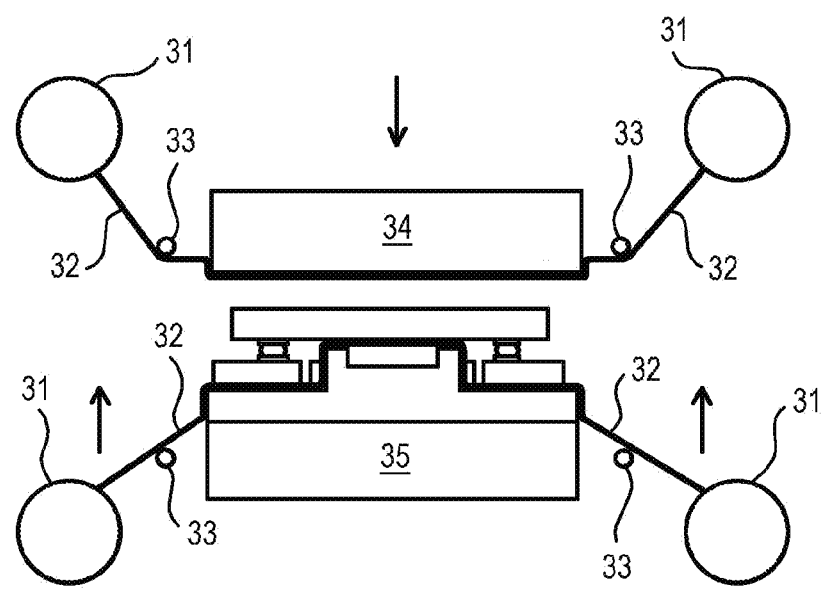

FIG. 3C shows the actuation of the first and second mold tools 34 and 35 and their movement until their respective end positions. Moving the first and second mold tools 34 and 35 as shown by the arrows causes pressing of the films 32 into a desired end position as shown in FIG. 3C. It should be mentioned that due to the fact that the sensor element 12 is disposed in a recess of the first main face 11A, it will not be touched by the plastic film 32.

Figure 3D:
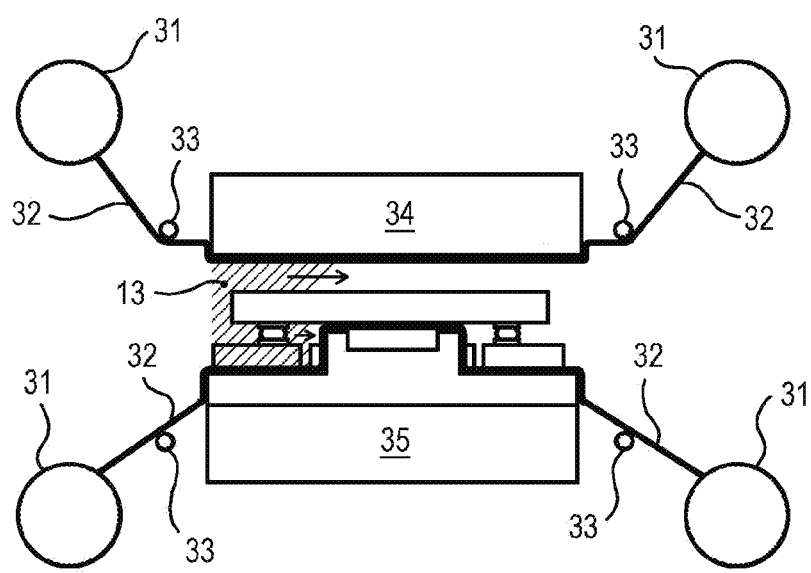

FIG. 3D illustrates the transfer molding process. The molding material 13 is first liquefied by heat and pressure and then forced into the closed molding apparatus 30 until the entire space inside the molding apparatus 30 is filled with the molding material 13. The molding material 13 is held there under additional heat and pressure until all material is solidified, i.e. cured. FIG. 3D shows the package during the molding process in a particular moment when only less than a half of the empty space is occupied by the pressed-in mold material 13 (shown as dashed area).

Figure 3E:
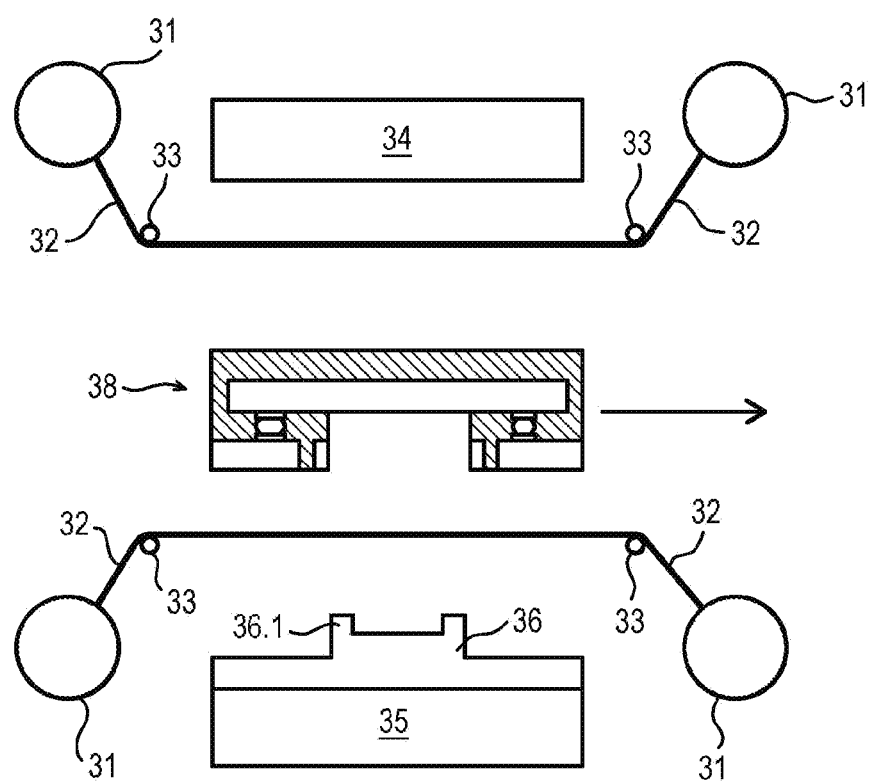

FIG. 3E illustrates a situation after the molding process has finished. After opening the molding apparatus 30, the molded package 38 can be unloaded.

It should be added that the illustration as of FIG. 3 depicted only one semiconductor chip to be encapsulated by the molding process. In fact, however, in most cases an eWLP (extended wafer level package) process will be performed in which a plurality of semiconductor chips 11 mounted on a substrate 14 will be molded over in the film-assisted molding process. If necessary, the semiconductor chips and the substrates can be mounted on an auxiliary carrier before the molding process. The auxiliary carrier can be a rigid substrate or a flexible carrier like, for example, a tape.

According to another example of the method, it is also possible to fabricate the electronic device of FIG. 1 without utilizing the film-assisted molding process. It may, for example, be sufficient to press a mold-stopping member like the stamp 36 against the first main face of the semiconductor chip in the same way as it is shown in FIG. 3B so that the mold material is prevented from flowing into the area below the sensor element during the transfer molding process.

Figure 4A:
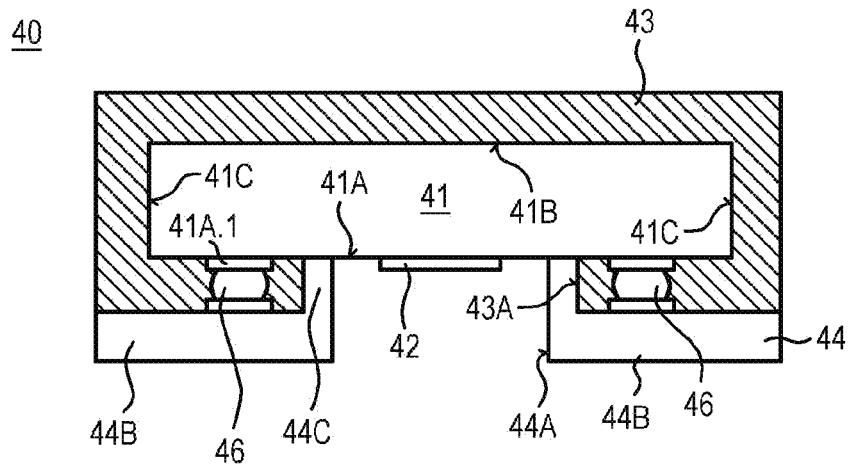
FIG. 4 comprises FIGS. 4A and 4B and shows a schematic cross-sectional side view representation (A) and a down view representation (B) of an electronic device comprising a substrate with an opening comprising an elevated ring-like protrusion integral with the substrate.
Figure 4B:
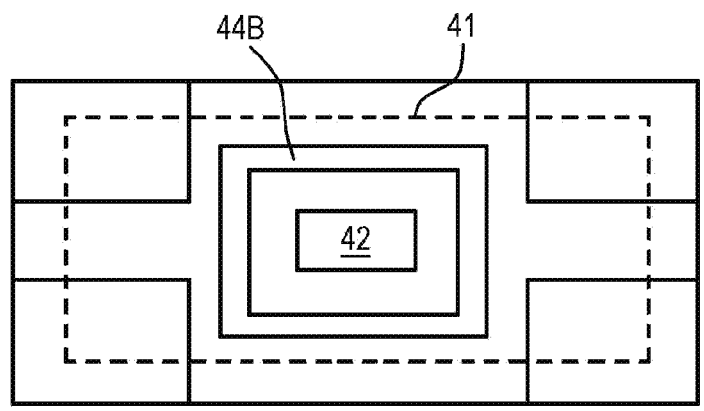

FIG. 4 comprises FIGS. 4A and 4B and shows another example of an electronic device according to the first aspect. The electronic device 40 of FIG. 4 comprises a semiconductor chip 41 comprising a first main face 41A, a second main face 41B opposite to the first main face 41A, side faces 41C connecting the first and second main faces 41A and 41B, and a sensor element 42 or actuator element 42 disposed at the first main face 41A. The electronic device 40 further comprises a substrate 44, wherein the semiconductor chip 41 is disposed above the substrate 44. The semiconductor chip 41 is arranged in a flip-chip configuration so that the first main face 41A of the semiconductor chip 41 faces the substrate 44. The substrate 44 comprises a substrate opening 44A, the substrate opening 44A permitting passage of signals to the sensor element 42 or from the actuator element 42.

The electronic device 40 further comprises an encapsulation material 43 covering the second main face 41B and the side faces 41C, the encapsulation material 43 comprising an encapsulation material opening 43A so that the sensor element 42 is exposed to the outside.

According to the example of the electronic device 40 as shown in FIG. 4, the substrate 44 comprises a ring-like protrusion 44C which is formed integral with the substrate 44 and extends towards the semiconductor chip 41. The substrate opening 44A is defined by the inner diameter of the ring-like protrusion 44C, i.e. the space between the inner walls of the protrusion 44C. The protrusion 44C can have a circular or a rectangular shape. The vertical extension of the protrusion 44C may be dimensioned such that the protrusion will reach to or near to the first main face 41A of the semiconductor chip 41 so that the protrusion 44C efficiently prevents the encapsulation material to flow into the inner space in the molding process. The semiconductor chip 41 may have contact pads 41A.1 situated on the first main face 41A. They may be connected to substrate portions 44B of the substrate 44 by copper pillars or bumps 46. The protrusion 44C may have the same or at least approximately the same height as the copper pillars 46.

Figure 5A:
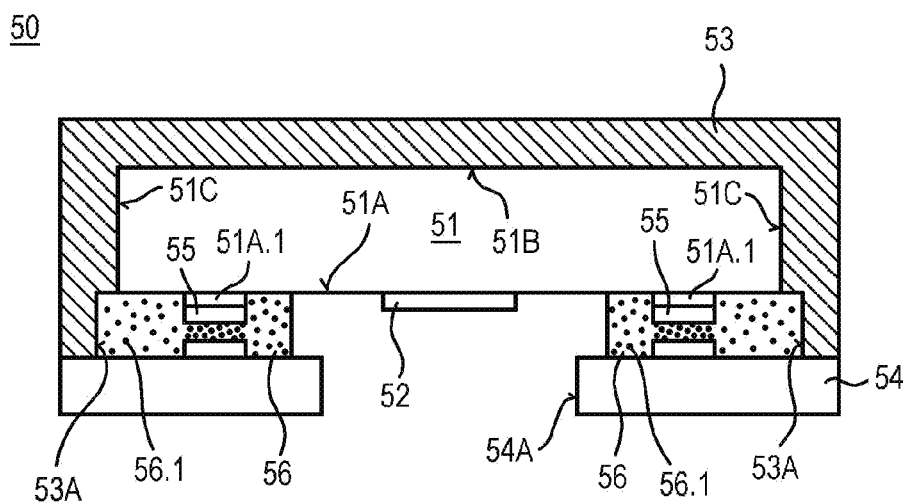
FIG. 5 comprises FIGS. 5A and 5B and shows a schematic cross-sectional side view representation (A) and a down view representation (B) of an electronic device comprising a ring-like structure of a glue disposed on the semiconductor chip and the encapsulation material and surrounding the sensor element and having an anisotropic electrical conductance.
Figure 5B:
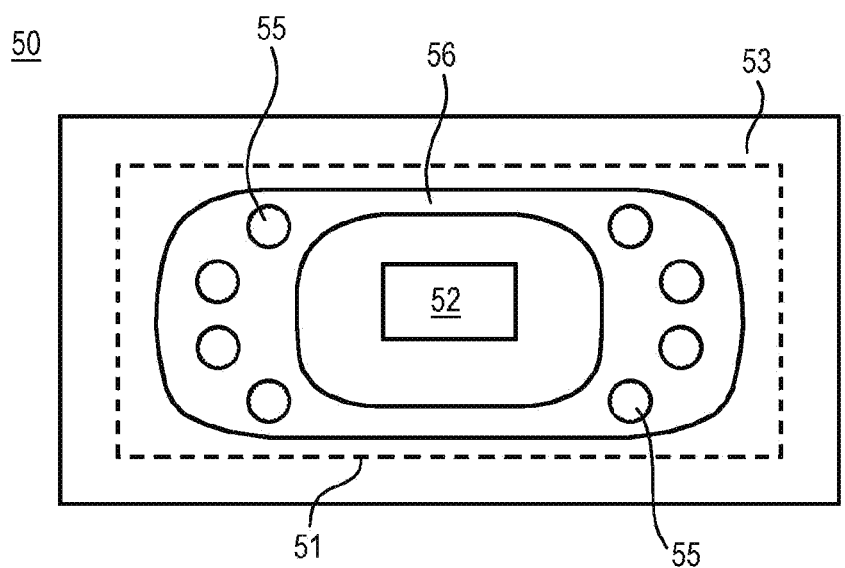

FIG. 5 comprises FIGS. 5A and 5B and shows another example of an electronic device according to the first aspect. The electronic device 50 of FIG. 5 comprises a semiconductor chip 51 comprising a first main face 51A, a second main face 51B opposite to the first main face 51A, side faces 51C connecting the first and second main faces 51A and 51B, and a sensor element 52 or actuator element 52 disposed at the first main face 51A. The electronic device 50 further comprises a substrate 54, wherein the semiconductor chip 51 is disposed above the substrate 54. The semiconductor chip 51 is arranged in a flip-chip configuration so that the first main face 51A of the semiconductor chip 51 faces the substrate 54. The substrate 54 comprises a substrate opening 54A, the substrate opening 54A permitting passage of signals to the sensor element 52 or from the actuator element 52.

The electronic device 50 further comprises an encapsulation material 53 covering the second main face 51B and the side faces 51C, the encapsulation material 53 comprising an encapsulation material opening 53A so that the sensor element 52 is exposed to the outside.

According to the example of the electronic device 50 as shown in FIG. 5, a ring-like structure 56 of an adhesive or a glue is disposed at an entire wall of the encapsulation material opening 53A. According to an example thereof, the adhesive or glue comprises anisotropic properties, i.e. an anisotropic electrical conductivity wherein it is originally non-conductive but may become conductive upon the exertion of pressure.

The semiconductor chip 51 may comprise contact pads 51A.1 disposed on the first main face 51A. In the example as shown in FIG. 5 a pillar or bump like a copper pillar or bump 55 is disposed on each one of the contact pads 51A.1. FIG. B is a cross-section in a plane going through two copper pillars 55 on either side of the semiconductor chip 51.

More specifically, the adhesive or glue may comprise a plastic polymer filled with a certain amount of metal particles 56.1, in particular silver particles 56.1. Metal particles 56.1 in a polymer may provide electrical conductivity to the filled material. The electrical conductivity of the filled polymer does not necessarily increase proportionally with the fill factor, but may rise rather abruptly at a so-called percolation threshold. The percolation threshold may occur when the fill factor is high enough for metallic particles 56.1 to touch each other and thus provide conductive paths. The volumetric fill factor of the metallic particles 56.1 in the thermal plastic polymer may be in a range from 20%-90%. Even with a fill factor near or above 90%, the filled polymer does not necessarily become electrically conductive. Only if a certain amount of pressure is exerted upon a certain area of the polymer material, the percolation threshold may be reached and the material becomes conductive. This is indicated in FIG. 5A by the increased density of metallic particles 56.1 in the polymer material 46 directly under the copper pillars 55. The ring-like structure 56 can be applied onto the first main face 51A of the semiconductor chip 51 such as shown in FIG. 5B so that it embeds the copper pillars 55. Then, the semiconductor chip 51 with the deposited ring-like structure 56 is pressed onto a leadframe 54 thereby exerting pressure on the polymer material 56 directly under the copper pillars 55 and thus making these areas electrically conductive.

For fabricating an electronic device 50 of FIG. 5, a transfer molding process can be applied. It will not be necessary to apply a film-assisted transfer molding such as that illustrated in FIG. 3, since the ring-like structure 56 will act as an effective mold stopper so that no encapsulation material may enter the region immediately underneath the sensor element 52.

Figure 6:
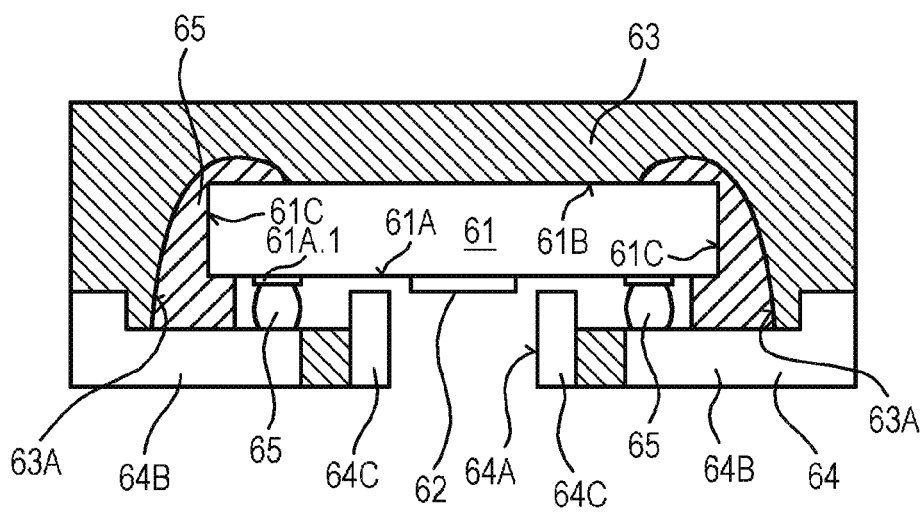
FIG. 6 shows a schematic cross-sectional side view representation of an electronic device comprising a ring-like structure of an adhesive material disposed between the semiconductor chip and the encapsulation material.

FIG. 6 comprises a further example of an electronic device according to the first aspect. The electronic device 60 of FIG. 6 comprises a semiconductor chip 61 comprising a first main face 61A, a second main face 61B opposite to the first main face 61A, side faces 61C connecting the first and second main faces 61A and 61B, and a sensor element 62 or actuator element 62 disposed at the first main face 61A. The electronic device 60 further comprises a substrate 64, wherein the semiconductor chip 61 is disposed above the substrate 64, the first main face 61A of the semiconductor chip 61 facing the substrate 64, wherein the substrate 64 comprises a substrate opening 64A, the substrate opening 64A permitting passage of signals to the sensor element 62 or from the actuator element 62.

The electronic device 60 further comprises an encapsulation material 63 covering the second main face 61B of the semiconductor chip 61, the encapsulation material 63 comprising an encapsulation material opening 63A so that the sensor element 62 is exposed to the outside.

According to the example of an electronic device 60 as shown in FIG. 6, the encapsulation material 63 only partly covers the second main face 61B of the semiconductor chip 61. In addition a ring-like structure 65 of an adhesive or a glue is disposed at an entire wall of the encapsulation material opening 63A. As shown in the example of FIG. 6, the ring-like structure 65 may cover the side faces 61C of the semiconductor chip 61 and it may also partly cover the second main face 61B of the semiconductor chip 61. The ring-like structure 65 may also be arranged in such a way that it does not cover the second main face 61B and also not the side faces 61C or only partly the side faces 61C.

According to the example of the electronic device 60 as shown in FIG. 6, the substrate 64 may comprise a ring-like glue stopper portion 64C, which is electrically isolated from the electrical portions 64B of the substrate 64 and which is intended to prevent flow of the glue 65 to the region of the sensor element 62. The substrate 64 can thus be configured as a pre-mold substrate 64 comprising encapsulation material between the glue stopper portion 64C and the electrical portions 64B of the substrate 64. The glue stopper portion 64C may extend vertically to just below the first main face 61A of the semiconductor chip 61 as shown in FIG. 6. As shown in FIG. 6, the inner diameter of the glue stopper portion 64C may be slightly greater than the lateral size of the sensor element 62.

According to an example, the electronic device 60 further comprises (copper) pillars or bumps 65 connecting contact pads 61A.1 of the semiconductor chip 61 with the electrical portions 64B of the substrate 64, respectively. In this example the copper pillars 65 do not extend through the encapsulation material 63 or the glue 65.

Figure 7:
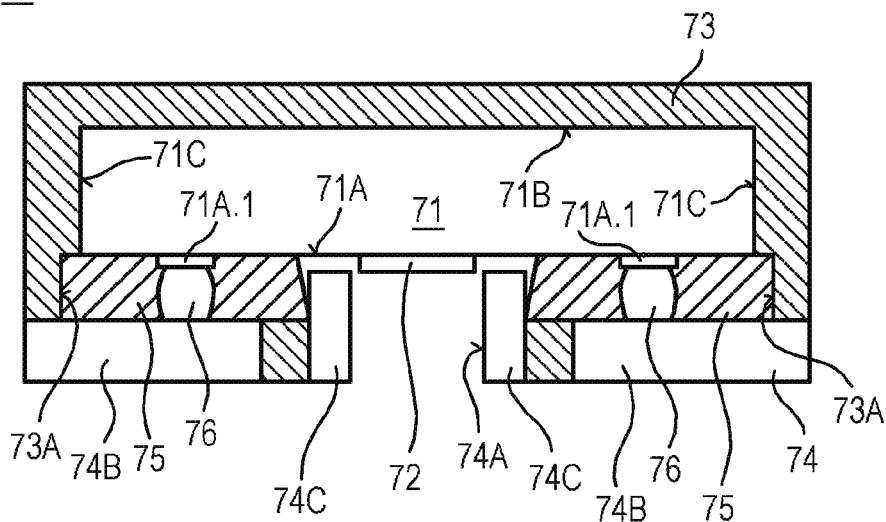
FIG. 7 shows a schematic cross-sectional side view representation of an electronic device comprising a ring-like structure of an adhesive material surrounding the sensor element on the first main face of the semiconductor chip.

FIG. 7 shows a further example of an electronic device according to the disclosure according to the first aspect. The electronic device 70 of FIG. 7 comprises a semiconductor chip 71 comprising a first main face 71A, a second main face 71B opposite to the first main face 71A, side faces 71C connecting the first and second main faces 71A and 71B, and a sensor element 72 or actuator element 72 disposed at the first main face 71A. The electronic device 70 further comprises a substrate 74, wherein the semiconductor chip 71 is disposed above the substrate 74, the first main face 71A of the semiconductor chip 71 facing the substrate 74, wherein the substrate 74 comprises a substrate opening 74A, the substrate opening 74A permitting passage of signals to the sensor element 72 or from the actuator element 72.

The electronic device 70 of FIG. 7 further comprises an encapsulation material 73 covering the second main face 71B, and in this example also the side faces 71C, the encapsulation material 73 comprising an encapsulation material opening 73A so that the sensor element 72 is exposed to the outside.

According to the example of an electronic device 70 of FIG. 7, a ring-like structure 75 of an adhesive or a glue is disposed at an entire wall of the encapsulation material opening 73A. In this example the ring-like structure 75 is disposed only on the second main face 71B of the semiconductor chip 71. The ring-like structure 75 surrounds the sensor element 72.

According to an example of the electronic device 70 the semiconductor chip 71 comprises at least one contact pad 71A.1 at the first main face 71A, the contact pad 71A.1 being connected with a contact area, in particular an electrical portion 74B, of the substrate 74. The electrical connection can be accomplished by, for example, copper pillars 76 extending through the adhesive or glue 75.

According to the example of the electronic device 70 as shown in FIG. 7, the substrate 74 may also comprise a glue stopper portion 74C similar in structure and function as the glue stopper portion 64C shown and described in the previous example of an electronic device 60 of FIG. 6.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. An electronic device, comprising:
   a semiconductor chip comprising a first main face, a second main face opposite to the first main face, side faces connecting the first and second main faces, and a sensor element or actuator element disposed at the first main face; and
   a substrate, wherein the semiconductor chip is disposed above a first major surface of the substrate, the first main face of the semiconductor chip facing the substrate, wherein the substrate comprises a substrate opening, the substrate opening permitting passage of signals to the sensor element or from the actuator element, and wherein the substrate includes a ring-like structure defining a perimeter of the substrate opening, the ring-like structure being spaced from remaining portions of the substrate.

2. The electronic device according to claim 1, further comprising
   an encapsulation material covering the second main face, the side faces, and a portion of the first main face, the encapsulation material comprising an encapsulation material opening above the first main face, the encapsulation material opening at least partially overlapping with the substrate opening.

3. The electronic device according to claim 2, wherein at least a part of a wall of the encapsulation material opening is exposed to the outside.

4. The electronic device according to claim 2, wherein a ring-like structure of an adhesive or a glue is disposed at an entire wall of the opening.

5. The electronic device of claim 2, wherein the ring-like structure is spaced from the remaining portions of the substrate by the encapsulation material.

6. The electronic device according to claim 1, wherein the semiconductor chip comprises at least one contact pad at the first main face, the contact pad being connected with a contact area of the substrate.

7. The electronic device according to claim 6, wherein the contact pad is connected to the contact area via a through-connection formed in an encapsulation material.

8. The electronic device according to claim 7, wherein the through-connection is formed by a copper pillar or a copper bump.

9. The electronic device according to claim 1, wherein the sensor element comprises a pressure sensor including at least a capacitive pressure sensor.

10. The electronic device of claim 1, wherein the ring-like structure extends from the first major surface to a position short of contact with the first main face of the semiconductor chip.

11. The electronic device of claim 10, wherein the ring-like structure is electrically isolated from the remaining portion of the substrate.

12. The electronic device of claim 1, wherein the ring-like structure extends from the first major surface to a position of contact with the first main face of the semiconductor chip.

13. The electronic device of claim 1, the first major surface of the substrate facing the semiconductor chip, the first major surface of the substrate including a first major surface of the ring-like structure and a first major surface of the remaining portions of the substrate.

14. The electronic device of claim 13, the remaining portion of the substrate comprising contact portions.

15. An electronic device, comprising:
    a semiconductor chip comprising a first main face, a second main face opposite to the first main face, side faces connecting the first and second main faces, and a sensor element or actuator element disposed at the first main face; and
    a substrate, wherein the semiconductor chip is disposed above the substrate, the first main face of the semiconductor chip facing the substrate, wherein the substrate comprises a substrate opening, the substrate opening permitting passage of signals to the sensor element or from the actuator element, wherein a ring-like structure of an adhesive or a glue is disposed at an entire wall of the opening, and wherein the adhesive or glue comprises an anisotropic electrical conductivity and is originally non-conductive but becomes conductive upon the exertion of pressure.

16. The electronic device according to claim 15, wherein a contact pad connected to a contact area via a through-connection formed in the adhesive or glue.

17. An electronic device, comprising:
    a semiconductor chip comprising a first main face comprising a MEMS structure disposed thereon; and
    a substrate, wherein the semiconductor chip is mounted on the substrate in a flip-chip configuration, wherein the substrate comprises a substrate opening, the substrate opening permitting passage of signals to or from the MEMS structure, and wherein the substrate includes a ring-like structure defining a perimeter of the substrate opening, the ring-like structure being spaced from remaining portions of the substrate.

18. The electronic device according to claim 17, further comprising
    an encapsulation material embedding the semiconductor chip, the encapsulation material comprising an opening adjacent to the MEMS structure so that the MEMS structure is exposed to the outside.

19. The electronic device according to claim 17, wherein the opening comprises a circular or rectangular cross-section.

20. The electronic device according to claim 17, wherein the MEMS structure comprises a pressure sensor including at least a capacitive pressure sensor.

21. A method for fabricating an electronic device, comprising:
    providing a semiconductor chip comprising a first main face, a second main face opposite to the first main face, side faces connecting the first and second main faces, and a sensor element or actuator element disposed at the first main face;
    providing a substrate, the substrate having a first major surface and comprising a ring-like structure defining a perimeter of a substrate opening, the ring-like structure being spaced from remaining portions of the substrate; and
    disposing the semiconductor chip above the substrate so that the first main face of the semiconductor chip faces the first major surface of the substrate and the substrate opening is situated below the sensor element or actuator element, thereby permitting passage of signals to the sensor element or from the actuator element, the ring-like structure protruding from the first major surface toward the first main face of the semiconductor chip.

22. The method according to claim 21, further comprising applying an encapsulation material to the semiconductor chip in such a way that the encapsulation material covers the second main face, the side faces and a portion of the first main face, wherein the encapsulation material comprises an opening adjacent to the sensor element so that the sensor element is exposed to the outside.

23. The method according to claim 22, wherein applying the encapsulation material is performed in such a way that at least a part of a wall of the opening is exposed to the outside.

24. The method according to claim 22, wherein during applying the encapsulation material a blocking member with spatial dimensions of the desired opening is placed in a position of the desired opening.

25. The method of claim 22, wherein before applying the encapsulation material a ring-like structure of a non-metallic and non-photoresist material is applied at the first main face, the ring-like structure surrounding the sensor element.

26. A method for fabricating an electronic device, comprising:
providing a semiconductor chip comprising a first main face, a second main face opposite to the first main face, side faces connecting the first and second main faces, and a sensor element or actuator element disposed at the first main face;
providing a substrate, the substrate having a first major surface and comprising a ring-like structure defining a perimeter of a substrate opening;
disposing the semiconductor chip above the substrate so that the first main face of the semiconductor chip faces the first major surface of the substrate and the substrate opening is situated below the sensor element or actuator element, thereby permitting passage of signals to the sensor element or from the actuator element, the ring-like structure protruding from the first major surface toward the first main face of the semiconductor chip; and
applying an encapsulation material to the semiconductor chip in such a way that the encapsulation material covers the second main face, the side faces and a portion of the first main face, wherein the encapsulation material comprises an opening adjacent to the sensor element so that the sensor element is exposed to the outside, wherein applying the encapsulation material comprises film-assisted molding.

* * * * *